United States Patent
Zou et al.

(10) Patent No.: US 10,937,924 B2
(45) Date of Patent: Mar. 2, 2021

(54) DISPLAY DEVICE AND ELECTRONICS APPARATUS

(71) Applicant: GOERTEK. INC, Shandong (CN)

(72) Inventors: Quanbo Zou, Shandong (CN); Zhe Wang, Shandong (CN); Peixuan Chen, Shandong (CN); Xiangxu Feng, Shandong (CN)

(73) Assignee: GOERTEK. INC, Weifang (CN)

( * ) Notice: Subject to any disclaimer, the term of this patent is extended or adjusted under 35 U.S.C. 154(b) by 0 days.

(21) Appl. No.: 16/339,482

(22) PCT Filed: Oct. 8, 2016

(86) PCT No.: PCT/CN2016/101475
§ 371 (c)(1),
(2) Date: Apr. 4, 2019

(87) PCT Pub. No.: WO2018/064805
PCT Pub. Date: Apr. 12, 2018

(65) Prior Publication Data
US 2019/0229234 A1 Jul. 25, 2019

(51) Int. Cl.
| | | |
|---|---|---|
| *H01L 33/00* | (2010.01) |
| *H01L 33/08* | (2010.01) |
| *G09F 9/33* | (2006.01) |
| *H01L 25/075* | (2006.01) |
| *H01L 33/38* | (2010.01) |
| *H01L 33/42* | (2010.01) |
| *H01L 33/54* | (2010.01) |

(52) U.S. Cl.
CPC ............... *H01L 33/08* (2013.01); *G09F 9/33* (2013.01); *H01L 25/0753* (2013.01); *H01L 33/38* (2013.01); *H01L 33/42* (2013.01); *H01L 33/54* (2013.01)

(58) Field of Classification Search
CPC ......... H01L 33/08; H01L 33/38; H01L 33/42; H01L 33/54; H01L 25/0753; G09F 9/33
See application file for complete search history.

(56) References Cited

U.S. PATENT DOCUMENTS

| | | | |
|---|---|---|---|
| 2008/0111771 A1 | 5/2008 | Miller et al. | |
| 2009/0179207 A1* | 7/2009 | Chitnis | .................. H01L 33/44 257/88 |
| 2014/0209936 A1 | 7/2014 | Oraw | |
| 2015/0357315 A1 | 12/2015 | Oraw | |
| 2016/0163940 A1* | 6/2016 | Huang | ................ H01L 25/0756 257/89 |

FOREIGN PATENT DOCUMENTS

| | | |
|---|---|---|
| CN | 101601079 A | 12/2009 |
| CN | 202205749 U | 4/2012 |
| CN | 104183585 A | 12/2014 |

* cited by examiner

*Primary Examiner* — Samuel A Gebremariam
(74) *Attorney, Agent, or Firm* — Ajay A. Jagtiani; Miles & Stockbridge P.C.

(57) ABSTRACT

A display device and an electronics apparatus, the display device comprises: a display substrate; and at least two stacked layers on the display substrate, wherein each stacked layer includes one micro-LED array.

8 Claims, 2 Drawing Sheets

DISPLAY DEVICE AND ELECTRONICS APPARATUS

CROSS-REFERENCE TO RELATED APPLICATIONS

This application is a National Stage of International Application No. PCT/CN2016/101475 filed on Oct. 8, 2016 which is hereby incorporated by reference in its entirety.

FIELD OF THE INVENTION

The present invention relates to the field of micro-LED display device, and more specifically, to a display device and an electronics apparatus.

BACKGROUND OF THE INVENTION

The micro-LED technology refers to the LED array of small size integrated on a substrate with high density. Currently, the micro-LED technology is starting development, and it is expected in the industry that a high-quality micro-LED product comes into the market. High-quality micro-LEDs will have a deep affection on the conventional display products such as LCD/OLED that have already been put into the market.

A micro-LED display device is a device with micro-LED array. Currently, a high quality micro-LED display device has encountered manufacturing difficulty in high resolution display.

Typically, the red, green and blue (RGB) sub-pixels within a pixel is horizontally positioned and laid-out in a display substrate in the prior art, which limited the highest display resolution. As shown in FIG. 1, the pixel size PS is determined by the sizes of a group of RGB sub-pixels (the sum of three sub-pixels).

FIGS. 2-3 show the procedure of transferring red, green and blue (RGB) sub-pixel arrays to a display substrate, respectively.

As shown in FIG. 2, a red sub-pixel array is first transferred to the display substrate 101. Then, the green sub-pixel array on a carrier substrate 102 is transferred to the display substrate 101. The transfer of the green sub-pixel array may have negative impact on the red sub-pixel array which has already been on the display substrate 101.

As shown in FIG. 3, the blue sub-pixel array on a carrier substrate 103 is transferred to the display substrate 101. Likewise, the transfer of the blue sub-pixel array may have negative impact on the red and green sub-pixel arrays which has already been on the display substrate 101.

Furthermore, in the prior art, arrays of massive RGB micro-LEDs are, color by color, transferred onto a same display surface. This may dramatically increase the manufacturing complicity. The manufacturing difficulty may also be increased due to surface topography changes after partial color transfer(s). Consequently, this may become a bottleneck of yield and quality at a decent fabrication cost.

Therefore, there is a demand in the art that a new solution for a display device shall be proposed to address at least one of the problems in the prior art.

SUMMARY OF THE INVENTION

One object of this invention is to provide a new technical solution for a display device.

According to a first aspect of the present invention, there is provided a display device, comprising: a display substrate; and at least two stacked layers on the display substrate, wherein each stacked layer includes one micro-LED array.

Optionally or alternatively, the stacked layers include, in sequence from the display substrate, a first stacked layer, a second stacked layer and a third stacked layer, and wherein the micro-LED array in the first stacked layer is a red micro-LED array, the micro-LED array in the second stacked layer is a green micro-LED array, and the micro-LED array in the third stacked layer is a blue micro-LED array.

Optionally or alternatively, micro-LEDs in different stacked layers are not overlapped in vertical direction.

Optionally or alternatively, micro-LEDs in different stacked layers are overlapped at least partially in vertical direction.

Optionally or alternatively, a dielectric layer is placed between two adjacent stacked layers.

Optionally or alternatively, micro-LEDs in each stacked layers are transparent.

Optionally or alternatively, a transparent filler is placed between micro-LEDs in each stacked layer.

Optionally or alternatively, micro-LEDs in the stacked layers are connected with the display substrate through transparent electrodes.

Optionally or alternatively, electrodes of micro-LEDs in the stacked layers are led out to the display substrate through vias.

According to a second aspect of the present invention, there is provided an electronics apparatus comprising a display device according to the present invention.

According to an embodiment of this invention, the present invention may simplify the manufacture of a display device, compared to a prior art display device with similar display resolution.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
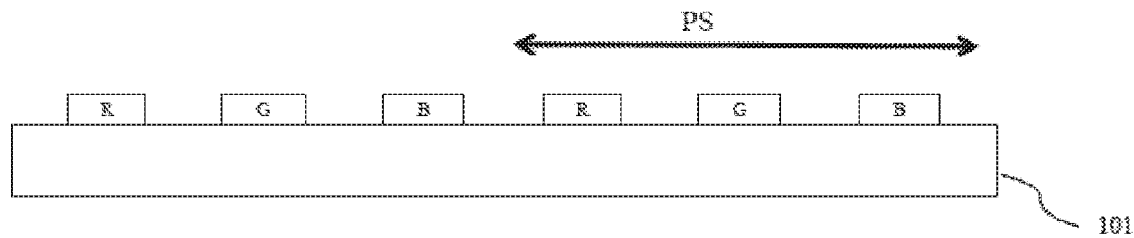
FIG. 1 is a schematic diagram showing a display device of the prior art.
Figure 2:
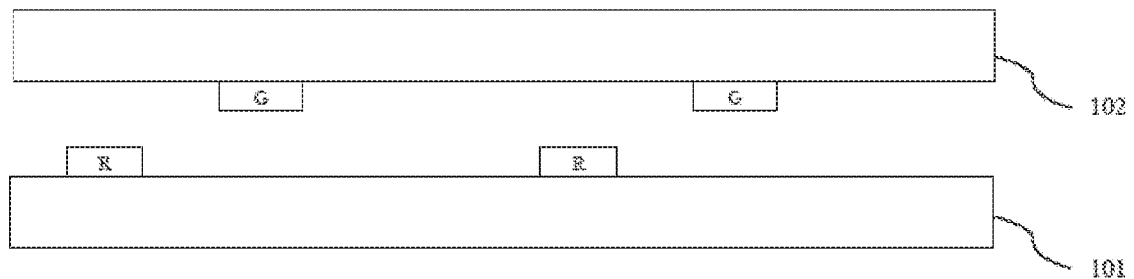
FIGS. 2-3 is a schematic diagram showing the prior art procedure of transferring RGB sub-pixel arrays onto a same display substrate.
Figure 3:
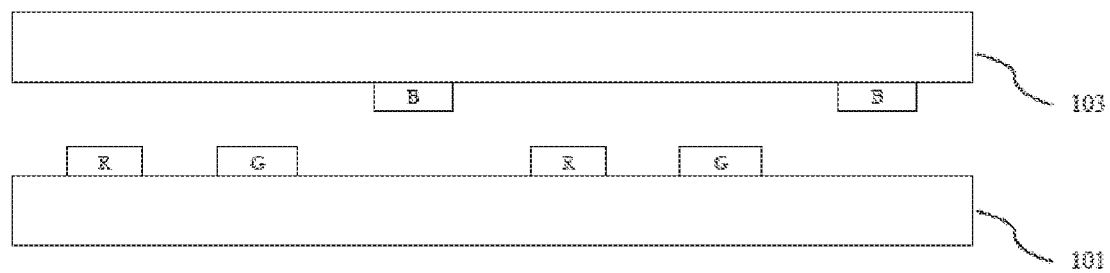

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

In the embodiment of this invention, it is proposed to stack RGB sub-pixels in different layers in the vertical direction. In this way, the display resolution may be increased, or it may simplify the manufacturing processes compared to a prior art display device with similar display resolution.

The embodiments or examples will be described with reference to FIGS. 4-5.

Figure 4:
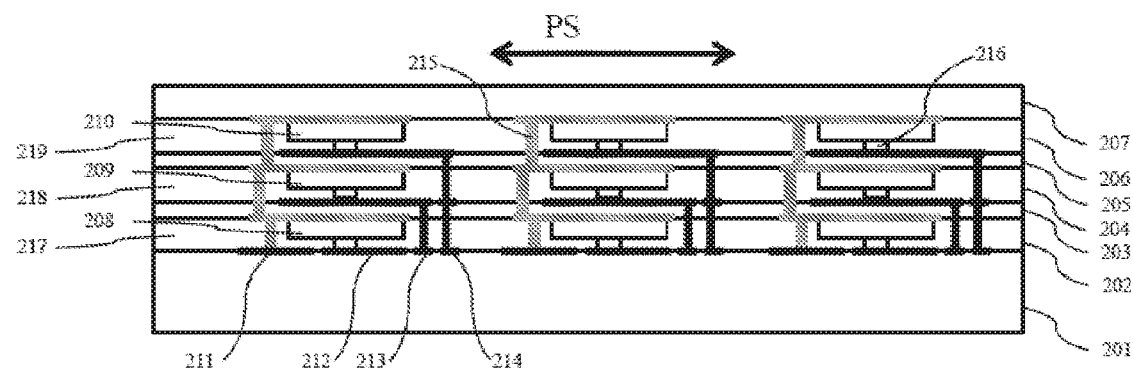
FIG. 4 is a schematic diagram showing a display device according to an embodiment of this invention.

FIG. 4 is a schematic diagram showing a display device according to an embodiment of this invention.

As shown in FIG. 4, the display device comprises a display substrate 201 and at least two stacked layers 202, 204, 206 on the display substrate. Each stacked layer 202, 204, 206 includes one micro-LED array.

Although FIG. 4 shows three layers 202, 204, 206, it will be understood by a person skilled in the art that there can be two layers or more than three layers. The micro-LED array in each layer can be of the same color or different color.

Since the micro-LEDs of sub-pixels are placed on different layers. In each layer, the distance between two micro-LEDs is enlarged compared with the prior art solution. Consequently, the manufacture may be easier compared with the prior art solution of putting all micro-LEDs on the same surface.

As shown in FIG. 4, in an example, the stacked layers include, in sequence from the display substrate 201, a first stacked layer 202, a second stacked layer 204 and a third slacked layer 206. The micro-LED array 208 in the first stacked layer 202 is a red micro-LED array. The micro-LED array 209 in the second stacked layer 204 is a green micro-LED array. The micro-LED array 210 in the third stacked layer 206 is a blue micro-LED array.

In such an arrangement, the influence between different layers of micro-LEDs will be reduced. For example, because the blue color has the highest frequency or has the highest energy among the three colors, it may excite fluorescent light on the other color micro-LEDs if it is placed beneath them. By the arrangement this invention, it reduces this fluorescence excitation.

In the embodiment of FIG. 4, the micro-LEDs 208, 209, 210 in different stacked layers 202, 204, 206 are overlapped in the vertical direction. It can be understood by a person skilled in the art that they can partially be overlapped in the vertical direction.

By such an arrangement, the pixel size may be reduced significantly compared with the prior art arrangement of placing all color micro-LEDs in the same display substrate.

In FIG. 4, a dielectric layer 203, 205 is placed between two adjacent stacked layers 202, 204, 206 to isolate them. The dielectric layers 203, 205 are transparent, for example.

The micro-LEDs 209, 210 are transparent. In an example, the micro-LEDs 208, 209, 210 in each stacked layers are transparent.

A transparent filler 217, 218, 219 is placed between micro-LEDs 208, 209, 210 in each stacked layer 202, 204, 206.

The micro-LEDs 208, 209, 210 in the stacked layers 202, 204, 206 are connected with the display substrate 201 through transparent electrodes 211, 212, 213, 214. For example, the electrodes 211 may be cathode electrodes. The electrodes 212, 213, 214 may be anode electrodes for micro-LEDs in different layers.

The electrodes of micro-LEDs 208, 209, 210 in the stacked layers 202, 204, 206 are led out to the display substrate 201 through vias 215, for example.

In this embodiment, the micro-LEDs of red, green and blue can be stacked vertically to form a RGB pixel. The micro-LEDs micro-LED can include III-V inorganic semiconductors.

For example, each color micro-LED array is transferred onto a planar surface through micro-bumps 216 on anode electrodes 212, 213, 214. After each transfer, a planarization is performed on the micro-LED array by filling/coating transparent filler 217, 218, 219 such as polymer or resist and etching-back or polishing. A transparent cover 207 can be placed on the top of the stacked micro-LED layers to protect the micro-LEDs.

Since the micro-LEDs of different colors can be placed in different layers, the impact of a subsequent transfer on the micro-LEDs which have already been placed on the display substrate will be reduced. For example, the red micro-LEDs are first transferred on the display substrate. Because the red and green micro-LEDs are in different layers, the impact on the red micro-LEDs by the transfer of the green micro-LEDs will be lowered. The same situation will be applied to the blue micro-LEDs.

Alternatively, the micro-LED array of each color can be placed in a pre-fabricated layer, such as a tape. In this manner, the manufacture process may be simplified. For example, the pre-fabricated layer can be made at a first position and is transported to a display manufacturing factory to be assembled into a display device.

Figure 5:
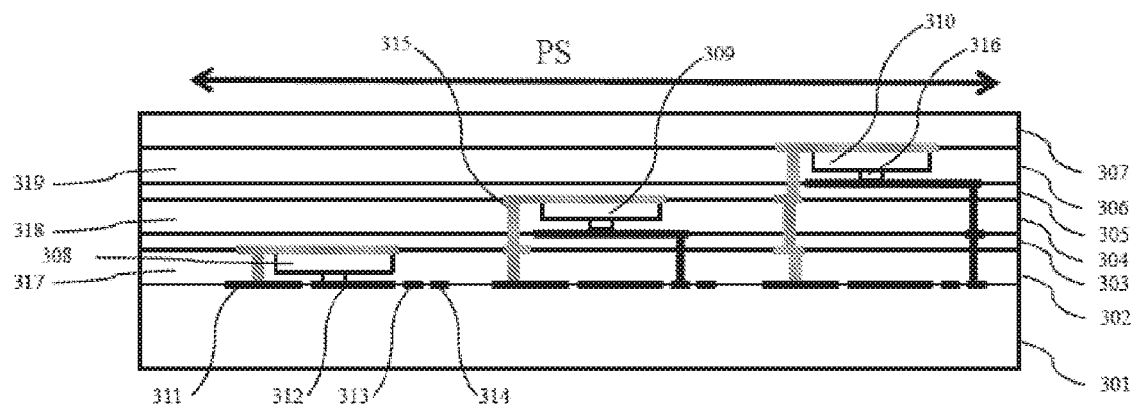
FIG. 5 is a schematic diagram showing a display device according to another embodiment of this invention.

FIG. 5 is a schematic diagram showing a display device according to another embodiment of this invention.

In FIG. 5, the micro-LEDs 308, 309, 310 in different stacked layers 302, 304, 306 are not overlapped in vertical direction. Repetitive description with FIG. 1 will be omitted.

As shown in FIG. 5, three layers 302, 304, 306 are stacked on the display substrate 301. Each layer includes a micro-LED array 308, 309, 310. A transparent filler 317, 318, 319 is filled between two micro-LEDs in each layer. The micro-LEDs are placed on micro-bumps 316 which are connected with anode electrodes 312, 313, 314. The cathodes of the micro-LEDs are connected with the cathodes electrode 311. The electrodes 311, 312, 313, 314 can be connected to the display substrate 301 through vias 315. A transparent cover 307 can be placed on the top of the stacked micro-LED layers to protect the micro-LEDs.

In FIG. 5, dielectric layer 303, 305 are placed between layers 302, 304, 306 for isolation. These dielectric layers 303, 305 can be omitted since the micro-LEDs in different layers are not overlapped.

In still another embodiment, the display device according to any embodiment of this invention can be used in an electronics apparatus such as a mobile phone, a pad, a laptop and headset and so on.

Although some specific embodiments of the present invention have been demonstrated in detail with examples, it should be understood by a person skilled in the art that the above examples are only intended to be illustrative but not to limit the scope of the present invention.

What is claimed is:

1. A display device, comprising:
a display substrate;
at least two stacked layers on the display substrate, wherein each stacked layer includes one micro-LED array;
transparent anode electrodes respectively configured for micro-LEDs in different stacked layers, and
micro-bumps on the transparent anode electrodes, disposed between corresponding transparent anode electrode and micro-LED,
wherein each micro-LED array is transferred through the micro-bumps on the transparent anode electrodes,
wherein the stacked layers include, in sequence from the display substrate, a first stacked layer, a second stacked layer and a third stacked layer,
wherein the micro-LED array in the first stacked layer is a red micro-LED array, the micro-LED array in the second stacked layer is a green micro-LED array, and the micro-LED array in the third stacked layer is a blue micro-LED array, and
wherein the transparent anode electrodes comprise a first transparent anode electrode, a second transparent anode electrode and a third transparent anode electrode, micro-LEDs in the first stacked layer is electrically connected with the display substrate through a transparent cathode electrode and the first transparent electrode, micro-LEDs in the second stacked layer is electrically connected with the display substrate through the transparent cathode electrode and the second transparent electrode, and micro-LEDs in the third stacked layer is electrically connected with the display substrate through the transparent cathode electrode and the third transparent electrode.

2. The display device according to claim 1, wherein micro-LEDs in different stacked layers are not overlapped in vertical direction.

3. The display device according to claim 1, wherein micro-LEDs in different stacked layers are overlapped at least partially in vertical direction.

4. The display device according to claim 1, wherein a dielectric layer is placed between two adjacent stacked layers.

5. The display device according to claim 1, wherein micro-LEDs in each stacked layers are transparent.

6. The display device according to claim 1, wherein a transparent filler is placed between micro-LEDs in each stacked layer.

7. The display device according to claim 1, wherein electrodes of micro-LEDs in the different stacked layers are led out to the display substrate through vias.

8. An electronics apparatus comprising a display device according to claim 1.

* * * * *